United States Patent [19]

Quietzsch et al.

[11] 4,100,488

[45] Jul. 11, 1978

[54] APPARATUS FOR MEASURING ELECTRIC CURRENT

[75] Inventors: Gerhard Quietzsch, Bad Soden am Taunus; Bernd Greiner, Oberdorfelden; Lothar Pelz, Oberroden, all of Fed. Rep. of Germany

[73] Assignee: Hoechst Aktiengesellschaft, Frankfurt am Main, Fed. Rep. of Germany

[21] Appl. No.: 727,755

[22] Filed: Sep. 29, 1976

[30] Foreign Application Priority Data

Oct. 1, 1975 [DE] Fed. Rep. of Germany ....... 2543828

[51] Int. Cl.² .............................................. G01R 1/22
[52] U.S. Cl. .................................. 324/127; 324/117 R
[58] Field of Search .............. 324/127, 117 R, 117 H, 324/129; 336/176

[56] References Cited

U.S. PATENT DOCUMENTS 3,626,291 12/1971 Yauch et al. ..................... 324/117 R

FOREIGN PATENT DOCUMENTS 991,779 10/1951 France ................................ 324/127

Primary Examiner—Rudolph V. Rolinec
Assistant Examiner—Ernest F. Karlsen
Attorney, Agent, or Firm—Curtis, Morris & Safford

[57] ABSTRACT

Direct currents and alternating currents superposed upon same are measured by embracing the current conveying conductor with a prong-type meter. The jaws of the prong are provided with guide means for the current conveying conductor and with induction coils concentrically disposed with respect to the recess defined by the jaws. The prong is further provided with an electronic amplifier unit comprising an integrator for direct current, an amplifier, a filter and a rectifier for alternating current as well as means to display the measuring values. According to a special embodiment at least one jaw of the prong carries a thermometer projecting into the recess.

2 Claims, 3 Drawing Figures

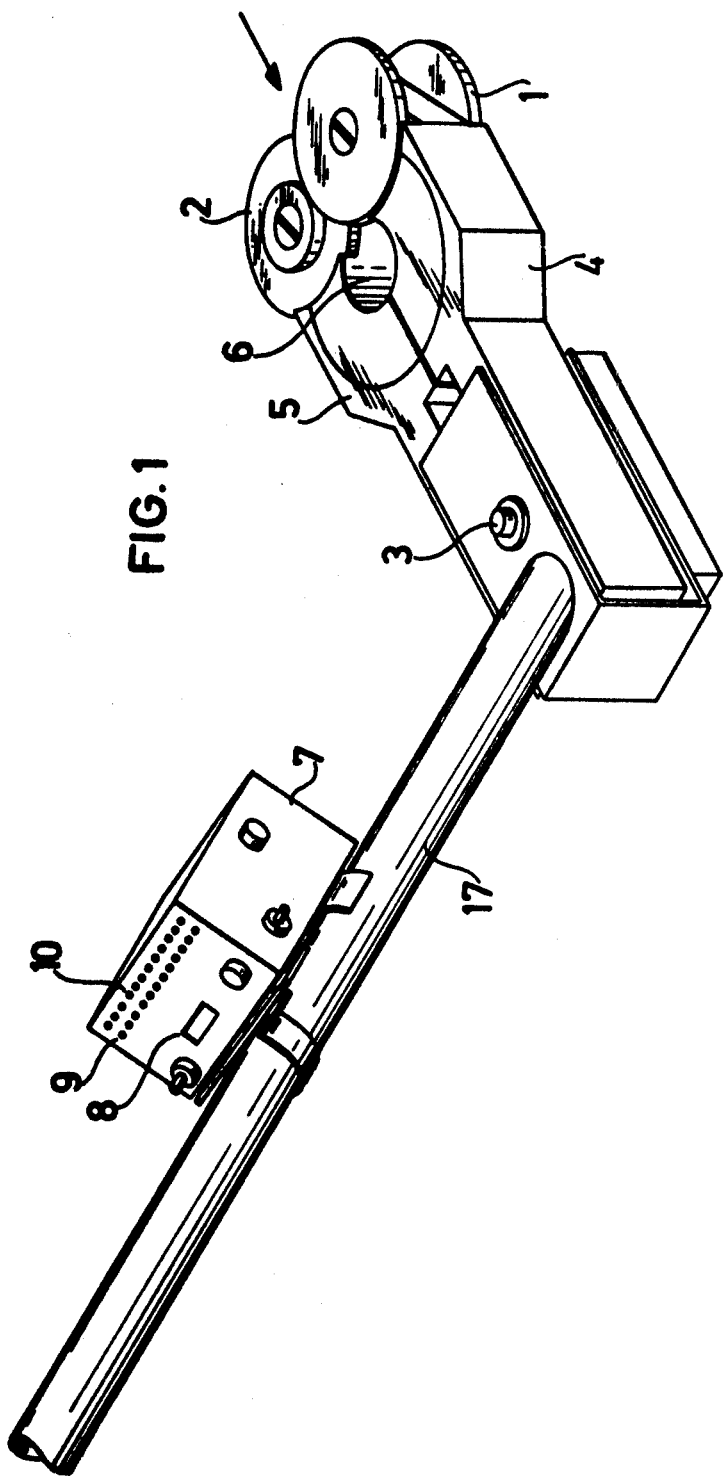

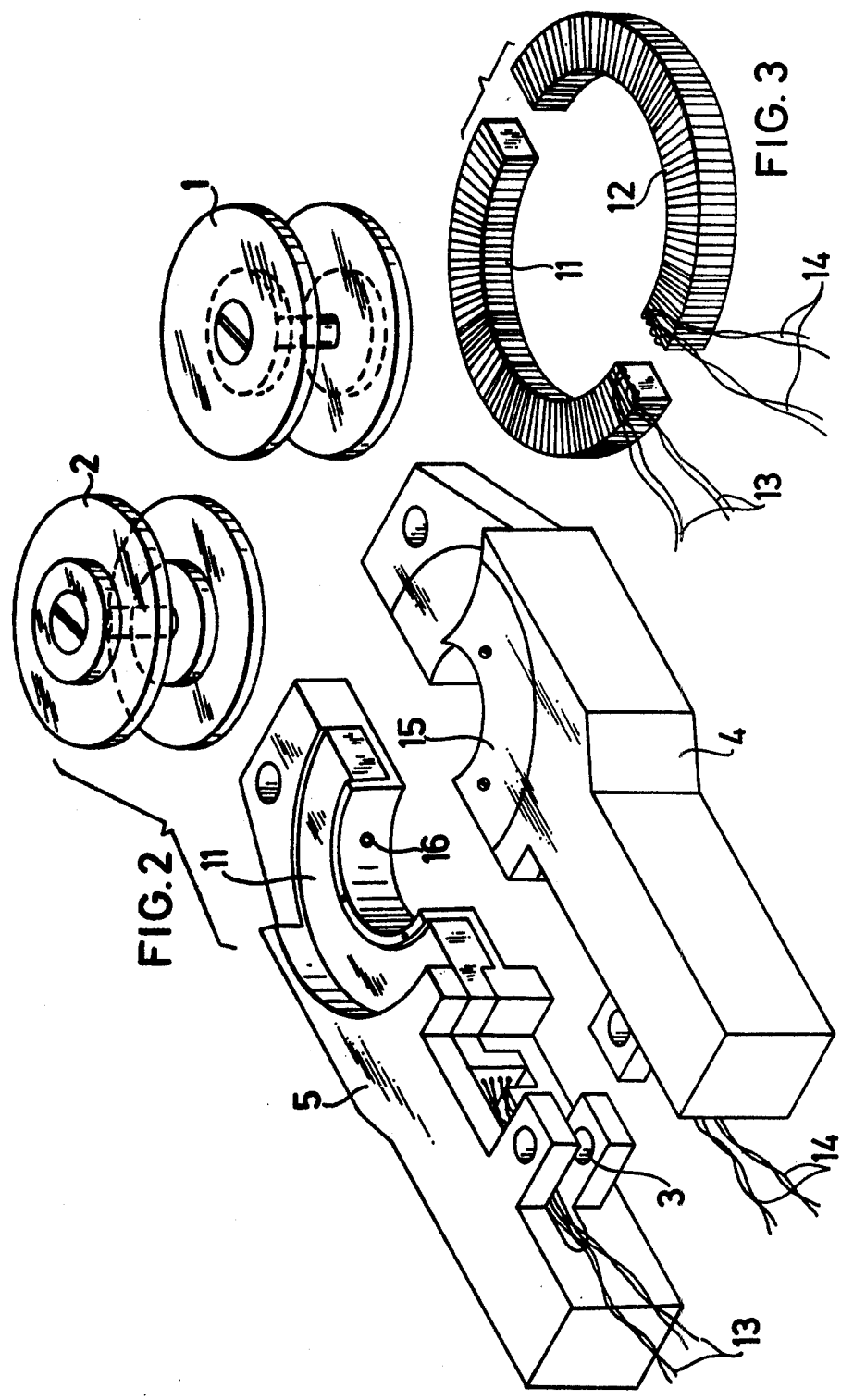

APPARATUS FOR MEASURING ELECTRIC CURRENT

This invention relates to an apparatus for measuring electric current, especially for simultaneously measuring direct current and superposed alternating current.

For measuring high electric currents, for example direct currents in electrolytic plants, there are used so-called prong-type meters which measure the current by means of the magnetic field produced by the current. For this purpose, the current conveying conductor is embraced by an annular iron yoke capable of being opened. The magnetic field is concentrated by the iron yoke in an air gap within the iron yoke and is there measured by means of a rotating iron system. Instead of the rotating iron system, it is also known to use several semi-conductor measuring elements the resistance of which depends on the magnetic field and which are disposed in said air gaps within the yoke. These arrangements have the drawback that the iron yoke is inconvenient to handle because of its high weight or cannot be used at all in narrow places because of its large dimensions. Moreover, it requires a precise mechanism since the air gaps must be reproduced sufficiently exactly on opening and shutting to obtain accurate measurements. For this reason, prong-type meters are very sensitive to mechanical vibrations.

There are also known prong-type meters the iron yoke of which is provided with air gaps at symmetrical points in which Hall generators are disposed. These prong-type meters likewise have the aforesaid disadvantages. In order to obtain a clean measurement of the direct current I by measuring the the magnetic field strength H along the closed path s according to the equation $$H \phi d s = I$$

the Hall generators in the prong-type meters should be placed one behind the other on a closed line around the current conveying conductor. But due to the narrow spaces available only a few Hall generators in favorable position can be used. Therefore, false measurements owing to the magnetic interference fields, which do not result from the current to be measured, cannot be excluded. Moreover, the prong-type meters are often in need of repair since the Hall generators frequently fall out at the high temperatures occurring in electrolytic processes.

It is an object of the present invention to avoid the aforesaid disadvantages and to provide an apparatus with which the electrolytic direct current can be measured simultaneously with the superposed alternating current always occuring with small electrode distances.

The apparatus in accordance with the invention comprises a pair of normally closed pivotally connected jaws provided with induction coils that substantially form a toroid the jaws of which embraces for the current conveying conductor within the toroid, wherein the jaws defining a recess also are provided with guide means for the current conveying conductor, which guide means partially limit the recess and when in contact with the current conveying conductor, urge the jaws to open so as to embrace or release the current conveying conductor, the coils being connected with an electronic amplifier unit comprising an integrator for direct current induced in the induction coils when the jaws are moved to embrace the current conveying conductor, an amplifier, a filter and a rectifier for alternating current induced in the induction coils by alternating currents flowing in the current conveying conductor as well as means to display the measuring value.

To examine the state of an electrode it is desirable to know its temperature which may indicate or relate to inadmissible contact resistances. For this reason in at least one jaw of the apparatus a thermometer projecting into the recess for the current conveying conductor is disposed. Besides resistance thermometers and NTC resistors, thermocouples are especially suitable because of their rapidity of action. The thermometer can be mounted in the recess under the action of a spring so that it is at any time in firm contact with the current conveying conductor when the jaws are closed. When the jaws are closed, the induction coils preferably form a ring (toroid). The guide means have several functions, they must ensure that the current conveying conductor slides into the recess of the jaws, it keeps the said conductor in its position in the recess and it prevents the ends of the coils from being damaged when the jaws are pushed over the current conveying conductor.

The electronic amplifying unit is an integral part of the apparatus of the invention. Besides the electronic elements mentioned above, it is provided with a switch permitting a directional deletion of the measuring value for the direct current. This switch is connected with a device suitable to set a given amplitude of the current intensity. The device approaches a time element which releases the switch for the deletion.

The apparatus of the invention will now be described in further detail and by way of example only with reference to the accompanying drawing in which FIG. 1 is a perspective view of the apparatus for the simultaneous measurement of direct current and alternating current superposed upon said direct current.

FIG. 2 shows the jaws of the apparatus in partly open position so that the induction coils can be seen and also shows the guide means in dismantled condition.

FIG. 3 represents the induction coils.

Referring now to the drawing, the apparatus is provided with a long handle 17 in case the current conveying conductor (not shown) should be near the floor. Two rotatably mounted rolls 1 and 2 are pressed against the current conveying conductor (characterized by an arrow), so that the jaws 4 and 5 pivotable about pivot point 3, are opened and slide around the current conveying conductor. After closure of the two jaws by the action of a spring (not shown), the current conveying conductor extends vertically through the centric recess 6. From the beginning to the completion of the embracing of the current conveying conductor that is, while the apparatus is moving with respect to the conductor, the magnetic field proportional to the direct current in the current conveying conductor appears as a changing magnetic flux which induces a current in the toroidal coil 11, 12 disposed within the two jaws. This current is summed in the electronic circuitry provided in the measuring unit during the embracing movement of the jaws around the current conveying conductor and serves as a direct measure of direct current flowing in the conductor. Its value is recorded and displayed in digital indicator 8.

For a better understanding, a developed view of the measuring part of the apparatus is shown in FIG. 2. In jaw 5 one half 11 of the toroid can be seen, this one half forming the completely closed toriod with the other half 12 when the jaws are closed. The two halves of the coil 11 and 12, shown again in FIG. 3, are wound in such a manner that the connections at the ends 13 and 14 are near the pivot point 3 and can be connected with the electronic circuitry 7. It is advantageous to make the toroid of several windings which are arranged in a manner such that in the large conductor circuit formed by the toroid no disturbing voltage is induced by adjacent magnetic interference fields.

It can be seen on FIG. 2 that after the engagement of the halves of the toroidal coil in the two jaws 4 and 5 circular shells 15 are pushed over the coil halves for mechanical protection. As soon as the jaws are closed around the current conveying conductor only the alternating current flowing in the conductor can induce a current in the closed toroid, this induced current being processed in the electronic circuitry 7 and indicated, for example, in a digitalized scale 9 formed by a series of light emitting or other light sources diodes.

For measuring the temperature of the current conveying conductor as a third measuring variable, a miniature thermocouple 16 is supported by a spring (not shown) in the recess of one jaw in such a manner that its thermojunction projects a little into the recess 6. When the jaws are closed around a current conveying conductor the thermojunction of the thermocouple is elastically pressed against the conductor and after a short while it acquires its temperature. The thermocouple is likewise connected with the electronic circuitry 7, which is provided with the comparative measuring point of the thermocouple. The temperature can be displayed, for example, on a digitalized scale 10 provided with light emitting diodes.

Hence, when the current conveying conductor is embraced by the jaws three measuring variables are simultaneously available for the direct current, for the portion of alternating current and for the temperature.

What is claimed is:

1. Apparatus for measuring the electrical power supplied to a load via a current conductor as determined by the direct current and superposed alternating current, comprising a pair of jaws pivotally coupled to each other, each of said jaws supporting a respective induction coil, said jaws being normally closed such that said respective induction coils substantially form a toroid; a recess portion in said jaws concentric with said toroid for receiving a current conductor; guide means disposed on said jaws in the vicinity of an end of said jaws remote from the pivotal coupling thereof, said guide means being formed of two rolls; means for moving said jaws toward and away from said current conductor such that forces are exerted on said jaws when said rolls contact said current conductor to urge said jaws to open whereby said guide means guide said current conductor to said recess portion whereat said jaws embrace said current conductor in said recess portion and to release said current conductor from said jaws, respectively; amplifier means coupled to said induction coils and including an integrator for integrating the direct current induced in said induction coils when said jaws are moved toward and embrace said current conductor, and an amplifier, filter and rectifier connected to sense the current induced in said induction coils by the alternating current flowing through said current conductor, and means for displaying an indication of the currents induced in said induction coils.

2. Apparatus as claimed in claim 1, wherein temperature measuring means is disposed in at least one jaw, which temperature measuring means projects into the recess for measuring the temperature of the current conveying conductor.

* * * * *